(12) United States Patent
Chung et al.

(10) Patent No.: US 11,653,462 B2
(45) Date of Patent: May 16, 2023

(54) ELECTRONIC DEVICE

(71) Applicant: InnoLux Corporation, Miao-Li County (TW)

(72) Inventors: Chia-Yu Chung, Miao-Li County (TW); Fu-Jen Ku, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/547,785

(22) Filed: Dec. 10, 2021

(65) Prior Publication Data
US 2022/0225521 A1    Jul. 14, 2022

(30) Foreign Application Priority Data
Jan. 11, 2021    (CN) .......................... 202110032724.4

(51) Int. Cl.
*H05K 5/00*    (2006.01)
*H05K 5/02*    (2006.01)

(52) U.S. Cl.
CPC ......... *H05K 5/0247* (2013.01); *H05K 5/0017* (2013.01)

(58) Field of Classification Search
CPC .......................... H05K 5/0247; H05K 5/0017
See application file for complete search history.

(56) References Cited

U.S. PATENT DOCUMENTS

| 2019/0004242 A1* | 1/2019 | Zhang | G02B 6/0085 |
| 2019/0072810 A1* | 3/2019 | Yang | G02B 6/0088 |

FOREIGN PATENT DOCUMENTS

| CN | 102520550 A | * | 6/2012 | |
| CN | 106195765 A | * | 12/2016 | ............... F21S 8/00 |
| CN | 108150896 A | * | 6/2018 | ............... F21S 8/00 |
| CN | 108254960 A | * | 7/2018 | |
| TW | I494659 B | | 8/2015 | |
| TW | I547740 B | | 9/2016 | |

* cited by examiner

*Primary Examiner* — Fatima N Farokhrooz
(74) *Attorney, Agent, or Firm* — Muncy, Geissler, Olds & Lowe, P.C.

(57) ABSTRACT

An electronic device includes a back frame, a panel, an adhesive layer, an adhesive member, and a connecting member. The panel is arranged on the back frame. The adhesive layer is adhered to the panel. The adhesive member is adhered to the back frame. The connecting member is adhered to the adhesive layer and the adhesive member.

18 Claims, 6 Drawing Sheets

ELECTRONIC DEVICE

CROSS REFERENCE TO RELATED APPLICATION

This application claims the benefits of the Chinese Patent Application Serial Number 202110032724.4, filed on Jan. 11, 2021, the subject matter of which is incorporated herein by reference.

BACKGROUND

1. Field

The present disclosure relates to an electronic device and, more particularly, to an electronic device that includes a connecting member between a back frame and a panel.

2. Description of Related Art

Generally, in an electronic device that includes a panel, the panel and a frame are fixed with adhesive to avoid generation of displacement between the panel and the frame. However, when the adhesive is attached to a frame with an uneven surface, the panel may be deformed, such as dislocation between different substrates in the panel, due to a pulling force generated between the panel and the frame, resulting in a taste issue of dark-state light leakage or mura of the panel.

Therefore, it is desired to provide an improved fixing design between the panel and the frame to solve the aforementioned problems.

SUMMARY

The present disclosure provides an electronic device including a connecting member between a back frame and a panel, so as to reduce the taste issue or improve the taste of the aforementioned electronic device.

The present disclosure provides an electronic device, which includes a back frame, a panel, an adhesive layer, an adhesive member, and a connecting member. The panel is arranged on the back frame. The adhesive layer is adhered to the panel. The adhesive member is adhered to the back frame. The connecting member is adhered to the adhesive layer and the adhesive member.

Other novel features of the disclosure will become more apparent from the following detailed description when taken in conjunction with the accompanying drawings.

DETAILED DESCRIPTION OF EMBODIMENT

Figure 1:
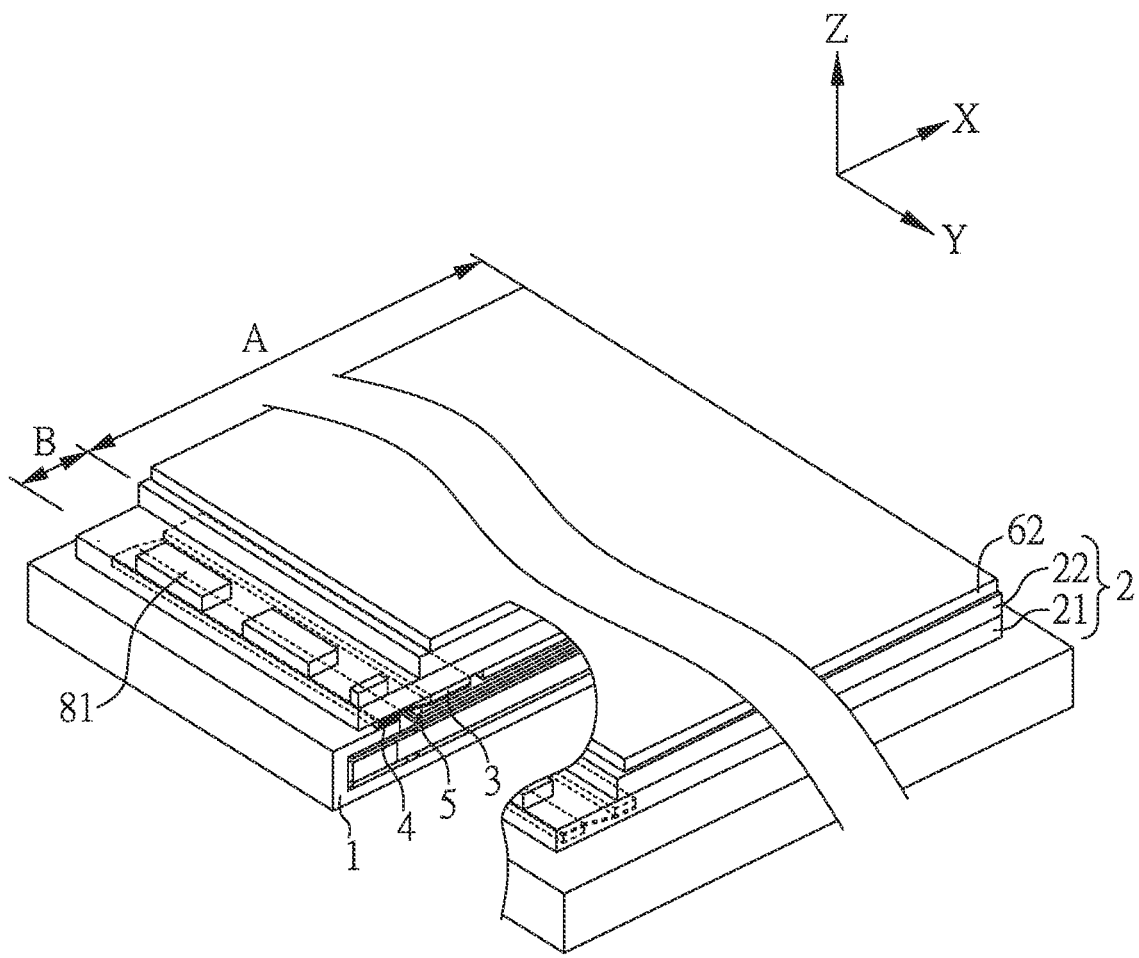
FIG. 1 is a three-dimensional schematic diagram of the electronic device according to an embodiment of the present disclosure.

The following provides different embodiments of the present disclosure. These embodiments are used to illustrate the technical content of the present disclosure, rather than to limit the claims of the present disclosure. A feature of one embodiment can be applied to other embodiments through suitable modification, substitution, combination, and separation.

The content of the disclosure will be described in detail below in conjunction with specific embodiments and drawings. In order to make the content clearer, the following drawings may be simplified schematic diagrams, and components may not be drawn to scale. The number, size, and arrangement of the components in the drawings are merely illustrative, but are not used to limit the disclosure. In addition, similar and/or corresponding reference numerals may be used in different embodiments for convenient and clear description of some embodiments, without representing any connection between the different embodiments and/or structures discussed.

It should be noted that, in the specification and claims, unless otherwise specified, having "one" component is not limited to having a single said component, but one or more said components may be provided.

In addition, in the specification and claims, unless otherwise specified, ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. A "first" component and a "second" component may appear together in the same component, or separately in different components. The existence of a component with a larger ordinal number does not necessarily mean the existence of another component with a smaller ordinal number.

In the entire specification and the appended claims of the present disclosure, certain words are used to refer to specific components. Those skilled in the art should understand that electronic device manufacturers may refer to the same components by different names. The present disclosure does not intend to distinguish those components with the same function but different names. In the claims and the following description, the words "comprise", "include" and "have" are open type language, and thus they should be interpreted as meaning "including but not limited to . . . ".

The terms "about", "equal to", "equal" or "same", "substantially" or "approximately" are generally interpreted as being within 20% of a given value or range, or interpreted as being within 10%, 5%, 3%, 2%, 1%, or 0.5% of a given value or range.

In the present disclosure, the thickness, length and width can be measured by using an optical microscope, and the thickness can be measured by the cross-sectional image in an electron microscope, but it is not limited thereto. In addition, there may be a certain error in any two values or directions used for comparison. If the first value is equal to the second value, it implies that there may be an error of about 10% between the first value and the second value. If the first direction is perpendicular to the second direction, the angle between the first direction and the second direction may be 80 to 100 degrees. If the first direction is parallel to the second direction, the angle between the first direction and the second direction may be 0 to 10 degrees. Unless otherwise defined, all terms (including technical and scientific terms) used here have the same meanings as commonly understood by those skilled in the art of the present disclosure. It is understandable that these terms, such as those defined in commonly used dictionaries, should be interpreted as having a meaning consistent with the relevant technology and the background or context of the present disclosure, rather than in an idealized or excessively formal interpretation, unless specifically defined.

In addition, the positions mentioned in the specification and claims, such as "above", "on" or "over", may mean that the two components are in direct contact, or may mean that the two components are not in direct contact. Similarly, the positions mentioned in the specification and claims, such as "below", "under" or "beneath", may mean that the two components are in direct contact, or may mean that the two components are not in direct contact. When the corresponding component (such as a film layer or region) is referred to as "on another component", it may be directly on another component, or there may be other components therebetween. On the other hand, when a component is referred as "directly on another component", there is no component between the two. In addition, when a component is referred to as "on another component", the two components have a vertical relationship in the top view direction, and this component may be above or below the other component, while the vertical relationship depends on the orientation of the device.

When a component or a film layer is referred to as "disposed on another component or another film layer" or "connected, attached or adhered to another component or another film layer", it may represent that the component or film layer is directly disposed on another component or film layer, or directly connected, attached or adhered to another component or film layer, or there may be other components or film layers therebetween. In contrast, when a component is referred to as "directly arranged, attached, or adhered to another component or film layer" or "directly connected, attached, or adhered to another component or film layer", there are no components or film layers therebetween.

In addition, relative terms such as "lower" or "bottom" and "upper" or "top" may be used in the embodiments to describe the relative relationship between one component and another component in the drawings. It can be understood that if the device in the drawing is turned upside down, the components described on the "lower" side will become the components on the "upper" side.

When a component (or a film layer) overlaps with another component (or another film layer), it means that the component (or a film layer) at least partially overlaps with another component (or another film layer) in the top view direction.

In addition, if a value is between a first value and a second value, the value may be the first value, the second value, or another value between the first value and the second value.

The detailed structure of the electronic device according to the present disclosure will be described in detail below, but the present disclosure is not limited to the following exemplary embodiments. The embodiments of the present disclosure may be combined with each other or other known structures to form another embodiment.

Figure 2A:
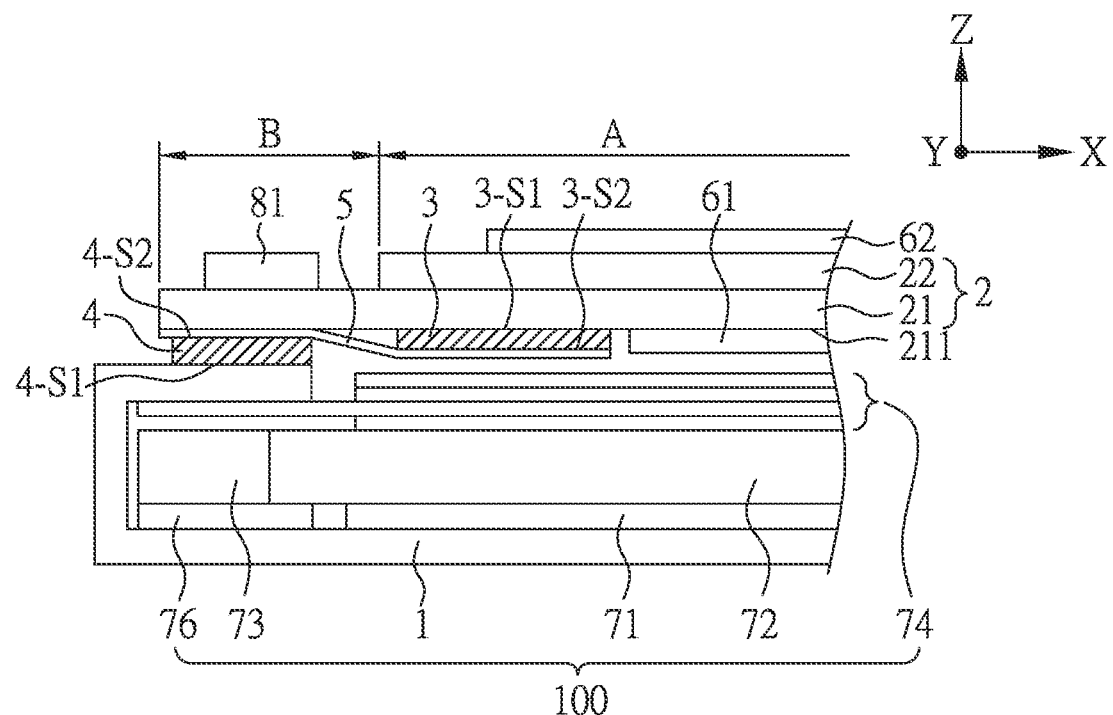
FIG. 2A and FIG. 2B are partial cross-sectional views taken along the first direction X in FIG. 1.
Figure 2B:
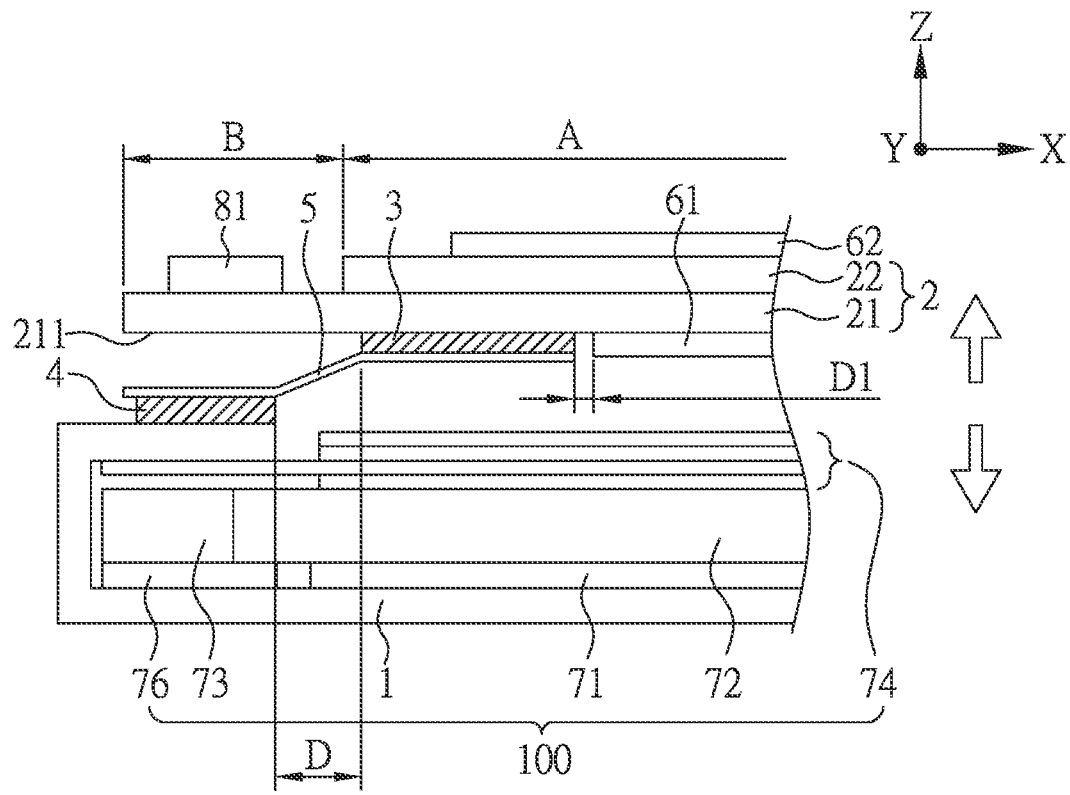

FIG. 1 is a three-dimensional schematic diagram of the electronic device according to an embodiment of the present disclosure; FIG. 2A and FIG. 2B are partial cross-sectional views taken along the first direction X in FIG. 1.

As shown in FIG. 1 to FIG. 2B, the electronic device of the present disclosure includes a back frame 1, a panel 2, an adhesive layer 3, an adhesive member 4, and a connecting member 5. The panel 2 is disposed on the back frame 1. The adhesive layer 3 is adhered to the panel 2. The adhesive member 4 is adhered to the back frame 1. The connecting member 5 is adhered to the adhesive layer 3 and the adhesive member 4. In the electronic device of the present disclosure, the back frame 1 and the panel 2 are fixed through the adhesive layer 3, the connecting member 5, and the adhesive member 4, wherein the connecting member 5 is adhered to the adhesive layer 3 and the adhesive member 4 to reduce the pulling force generated between the panel 2 and the back frame 1 due to using the adhesive member 4 to fix the panel 2 and the back frame 1 directly that may cause the panel to be deformed (for example, the dislocation between different substrates in the panel) and result in taste variations such as dark-state light leakage or mura of the panel.

In the electronic device of the present disclosure, the panel 2 has a first substrate 21 and a second substrate 22. The first substrate 21 and the second substrate 22 are disposed opposite to each other. The first substrate 21 has an overlap area A that overlaps with the second substrate 22, and a peripheral circuit area B that does not overlap with the second substrate 22. The adhesive layer 3 can be disposed substantially corresponding to the overlap area A. In other words, in the normal direction of the panel 2, the overlap area A of the first substrate 21 overlaps with the second substrate 22, and the peripheral circuit area B of the first substrate 21 does not overlap with the second substrate 22. In some embodiments, the adhesive layer 3 may substantially overlap the overlapping area A. In some embodiments, one side 3-S1 of the adhesive layer 3 may be adhered to part of the panel 2 (for example, the first substrate 21), and the other side 3-S2 of the adhesive layer 3 may be adhered to part of the connecting member 5. In other words, the adhesive layer 3 may be disposed between the connecting member 5 and the panel 2, and the connecting member 5 may be fixed to the panel 2 through the adhesive layer 3.

As shown in FIG. 2A and FIG. 2B, the adhesive layer 3 may be adhered to the panel 2 (for example, the first substrate 21) and, in the normal direction Z of the panel 2, the adhesive layer 3 is disposed, for example, substantially corresponding to the overlap area A, and overlaps with the overlap area A. In some embodiments, the adhesive layer 3 may be disposed or adhered on the first surface 211 of the first substrate 21, and the first surface 211 is, for example, a surface facing the back frame 1 or away from the second substrate 22.

In some embodiments, the adhesive member 4 is arranged or adhered to the back frame 1. For example, one side 4-S1 of the adhesive member 4 may be adhered to part of the back frame 1, and the other side 4-S2 of the adhesive member 4 may be adhered to part of the connecting member 5. In some embodiments, the adhesive member 4 may be disposed between the back frame 1 and the connecting member 5, and the connecting member 5 may be fixed to the back frame 1 through the adhesive member 4. In some embodiments, in the normal direction Z of the panel 2, the adhesive member 4 does not overlap with the overlap area A, for example.

Since one end of the connecting member 5 may be fixed to the panel 2 through the adhesive layer 3, and the other end of the connecting member 5 may be fixed to the back frame 1 through the adhesive member 4, the panel 2 and the back frame 1 may be fixed to each other through, for example, the adhesive layer 3, the adhesive member 4 and/or the connecting member 5, but it is not limited thereto. In the embodiment of the present disclosure, the adhesive 4 member, for example, is not in direct contact with or adhered to the panel 2 (for example, the first substrate 21), so as reduce the pulling force generated by the adhesive member 4 between the panel 2 and the back frame 100 thereby reducing the deformation or damage of the panel 2.

In some embodiments, as shown in FIG. 2B, in the normal direction Z of the panel 2, the adhesive layer 3 may not overlap with the adhesive member 4, and at least part of the connecting member 5 may not overlap with the adhesive layer 3 and/or the adhesive member 4. In some embodiments, in the first direction X (for example, a direction perpendicular to the normal direction Z of the panel 2), there may be a distance D between the adhesive layer 3 and the adhesive member 4, and the distance D may be greater than or equal to the thickness of the connecting member 5 (not labeled, for example, the maximum thickness of the member in the normal direction Z of the panel 2), but it is not limited thereto. The distance D is, for example, the minimum distance between the adhesive layer 3 and the adhesive member 4 in the first direction X.

In some embodiments, the electronic device may further include a first polarizer 61 and a second polarizer 62. The first polarizer 61 and the second polarizer 62 are respectively disposed on different substrates of the panel 2. For example, the first polarizer 61 is disposed on the first substrate 21, and the second polarizer 62 is disposed on the second substrate 22. In some embodiments, in the normal direction Z of the panel 2, the first polarizer 61 does not overlap with the adhesive layer 3, for example. In some embodiments, in the first direction X, there may be a distance D1 between the first polarizer 61 and the adhesive layer 3, for example. The distance D1 is, for example, the minimum distance between the first polarizer 61 and the adhesive layer 3 in the first direction X. In some embodiments, the distance D1 may be less than or equal to the distance D in the first direction X between the adhesive layer 3 and the adhesive member 4. In some embodiments (not shown), the distance D1 may be greater than or equal to the distance D in the first direction X between the adhesive layer 3 and the adhesive member 4. In some embodiments, the thickness of the first polarizer 61 may be greater than or equal to the thickness of the adhesive member 4, the thickness of the adhesive layer 3, and/or the thickness of the connecting member 5, but it is not limited thereto. The thickness of the aforementioned devices may be defined as the maximum thickness of the device in the normal direction Z of the panel 2, for example.

In some embodiments, the material of the first substrate 21 and/or the second substrate 22 may include glass, quartz, sapphire, ceramic, polycarbonate (PC), polyimide (PI), polyethylene terephthalate (PET), other suitable substrate materials or a combination thereof, but it is not limited thereto, and the first substrate 21 and the second substrate 22 may be prepared by the same or different materials. In some embodiments, the materials of the adhesive layer 3 and the adhesive member 4 are not particularly limited. The adhesive layer 3 and/or the adhesive member 4 may include, for example, glass glue, optical glue (such as UV curing glue), silicon glue, and double-sided tape, hot melt glue, moisture curing glue, AB glue, polymer glue or a combination thereof, but it is not limited thereto. In some embodiments, the materials of the adhesive layer 3 and the adhesive member 4 may be the same or different. In some embodiments, the material of the adhesive layer 3 and/or the adhesive member 4 may include, for example, black glue, which is used for shielding light.

In some embodiments, the electronic device further includes a backlight module 100. The backlight module 100 may include the back frame 1, a reflective sheet 71, a light guide plate 72, a light source 73, a circuit board 76, and an optical film set 74. The reflective sheet 71 is arranged in the back frame 1. The light guide plate 72 is arranged on the reflective sheet 71. The light source 73 may be arranged adjacent to the light guide plate 72. The light source 73 may be arranged on the circuit board 76 (for driving the light source 73). The optical film set 74 is disposed on the light guide plate 72. In some embodiments, the backlight module 100 may be an edge-type backlight module, but it is not limited thereto. In other embodiments, the backlight module may be a direct type backlight module.

In some embodiments, the material of the back frame 1 may include metal, such as iron, copper, aluminum, other suitable materials, or a combination thereof, but it is not limited thereto. In some embodiments, the material of the back frame 1 may include plastic or other suitable materials, but it is not limited thereto. In some embodiments, the optical film set 74 may be a single-layer or multi-layer film and, for example, may include a brightness enhancement film, a diffusion film, other optical films, or a combination thereof.

In some embodiments, the material of the connecting member 5 includes plastic, dielectric material, light-shielding material, reflective material, or a combination thereof, but is not limited thereto. The material of the connecting member 5 may include, for example, polyethylene terephthalate (PET), polycarbonate (PC), polyimide (PI), polyethylene (PE), but it is not limited thereto. When the material of the connecting member 5 is a light-shielding material, the light leakage may be reduced or alleviated.

In some embodiments, the first substrate 21 may have a peripheral circuit area B. In the normal direction Z of the panel 2, the peripheral circuit area B does not overlap with the second substrate 22. In some embodiments, the electronic device further includes at least one circuit component 81 disposed on the peripheral circuit area B of the first substrate 21. In the disclosure of FIG. 1, only the peripheral circuit area B on one side of the first substrate 21 is drawn, but the other side of the first substrate 21 may optionally include the peripheral circuit area B.

Figure 3:
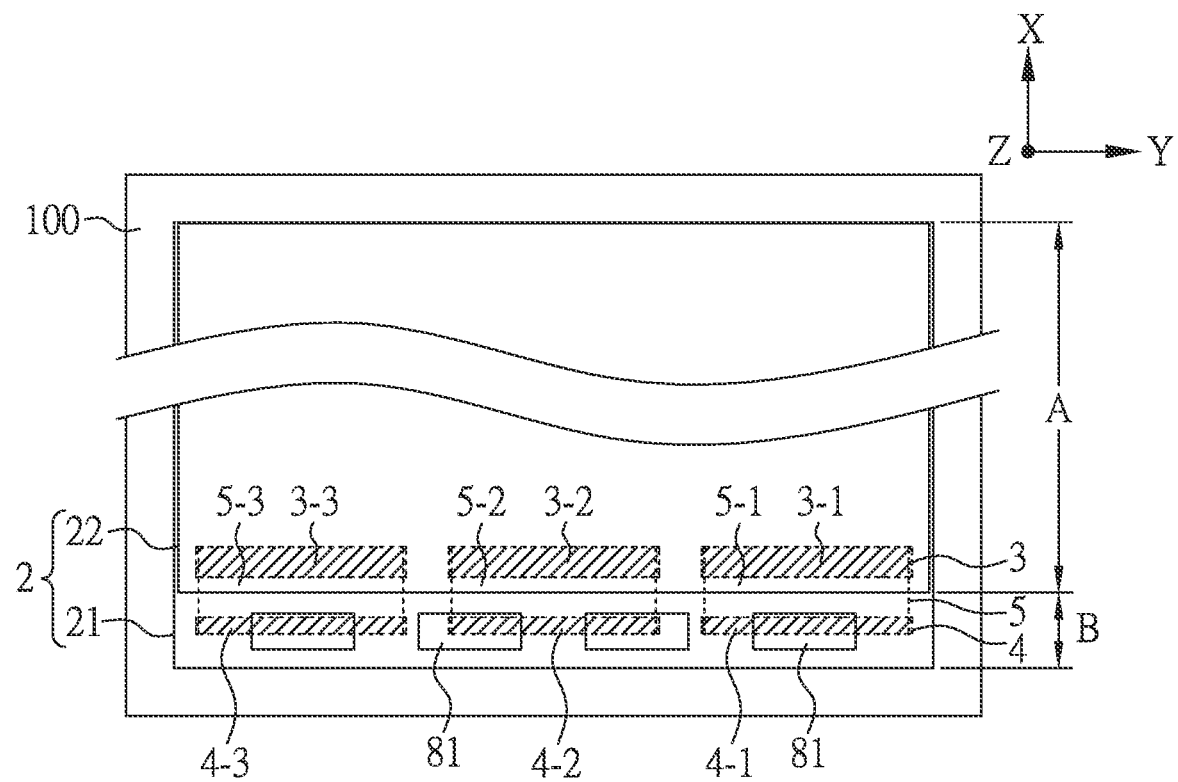
FIG. 3 is a partial perspective view of the electronic device in a top view direction according to an embodiment of the present disclosure.

FIG. 3 is a partial perspective view of an electronic device in a top view direction according to an embodiment of the present disclosure. The perspective view of FIG. 3 is viewed from a top view direction and, more specifically, viewed from top to bottom along the normal direction Z of the panel 2. For the convenience of description, in the perspective view of FIG. 3, some components, such as the first polarizer 61 and the second polarizer 62, are omitted. The electronic device of FIG. 3 is similar to the electronic device of FIG. 1, except for the following differences.

As shown in the perspective view of FIG. 3, the adhesive layer 3 may be arranged corresponding to the overlap area A, or overlap with the overlap area A, the adhesive member 4 may not overlap with the overlap area A, and the connecting member 5 may be adhered between the adhesive layer 3 and the adhesive member 4. The difference between FIG. 3 and FIG. 1 is that the adhesive layer 3, the adhesive member 4, and/or the connecting member 5 of FIG. 3 may be segmented into multiple portions, and the different portions of the adhesive member 4 and/or the connecting member 5 are arranged, for example, in sequence along the peripheral circuit area B of the first substrate 21. For example, there are one adhesive layer 3, one adhesive member 4 and/or one connecting member 5 in FIG. 1, and the adhesive layer 3, the adhesive member 4 and/or the connecting member 5 extend, for example, along the peripheral circuit area B of the first substrate 21. In the electronic device of FIG. 3, the adhesive layer 3 may be segmented into three portions (portion 3-1, portion 3-2, and portion 3-3) that are sequentially arranged along the peripheral circuit area B of the first substrate 21, the adhesive member 4 may be segmented into three portions (portion 4-1, portion 4-2 and portion 4-3) that are arranged in sequence along the peripheral circuit area B of the first substrate 21, and/or the connecting member 5 may be segmented into three portions (portion 5-1, portion 5-2 and portion 5-3) that are arranged in sequence along the peripheral circuit area B of the first substrate 21, but it is not limited thereto. In some embodiments, the number of portions of the adhesive layer 3, the adhesive member 4, and/or the connecting member 5 may be the same and corresponding to each other, but it is not limited thereto. In some embodiments (not shown), the number of portions of the adhesive layer 3, the adhesive member 4, and/or the connecting member 5 may be different. In some embodiments, the circuit component 81 may be an integrated circuit (IC), but it is not limited thereto.

In some embodiments, in the normal direction Z of the panel 2, a portion of the adhesive member 4 (for example, the portion 4-1) and/or a portion of the connecting member 5 (for example, the portion 5-1) may overlap with at least one circuit component 81, but it is not limited thereto. In some embodiments, a portion of the adhesive member 4 (for example, the portion 4-2) and/or a portion of the connecting member 5 (for example, the portion 5-2) may overlap with a plurality of circuit components 81, but it is not limited thereto. In some embodiments, the number of portions into which the adhesive layer 3, the adhesive member 4, and/or the connecting member 5 are segmented may be the same as or different from the number of the circuit components 81, for example.

In some embodiments, the dimensions (for example, length, width or area) or materials of different portions of the adhesive layer 3 (for example, the portion 3-1, the portion 3-2, and the portion 3-3) may be the same or different. In some embodiments, the dimensions (for example, length, width, or area) or materials of different portions (for example, the portion 5-1, the portion 5-2, and the portion 5-3) of the connecting member 5 may be the same or different. In some embodiments, the size (for example, length, width or area) or materials of different portions (for example, the portion 4-1, the portion 4-2, and the portion 4-3) of the adhesive member 4 may be the same or different. In some embodiments, the portion of the adhesive layer 3, the portion of the adhesive member 4, and/or the portion of the connecting member 5 that are corresponding or connected may have substantially the same or different lengths in the second direction Y (for example, the extending direction of the side of the first substrate 21). The length of the aforementioned component is defined as the maximum length of the component in the second direction Y, for example. In some embodiments, the second direction Y may be substantially the same as the arrangement direction of the circuit components 81, but it is not limited thereto.

Figure 4:
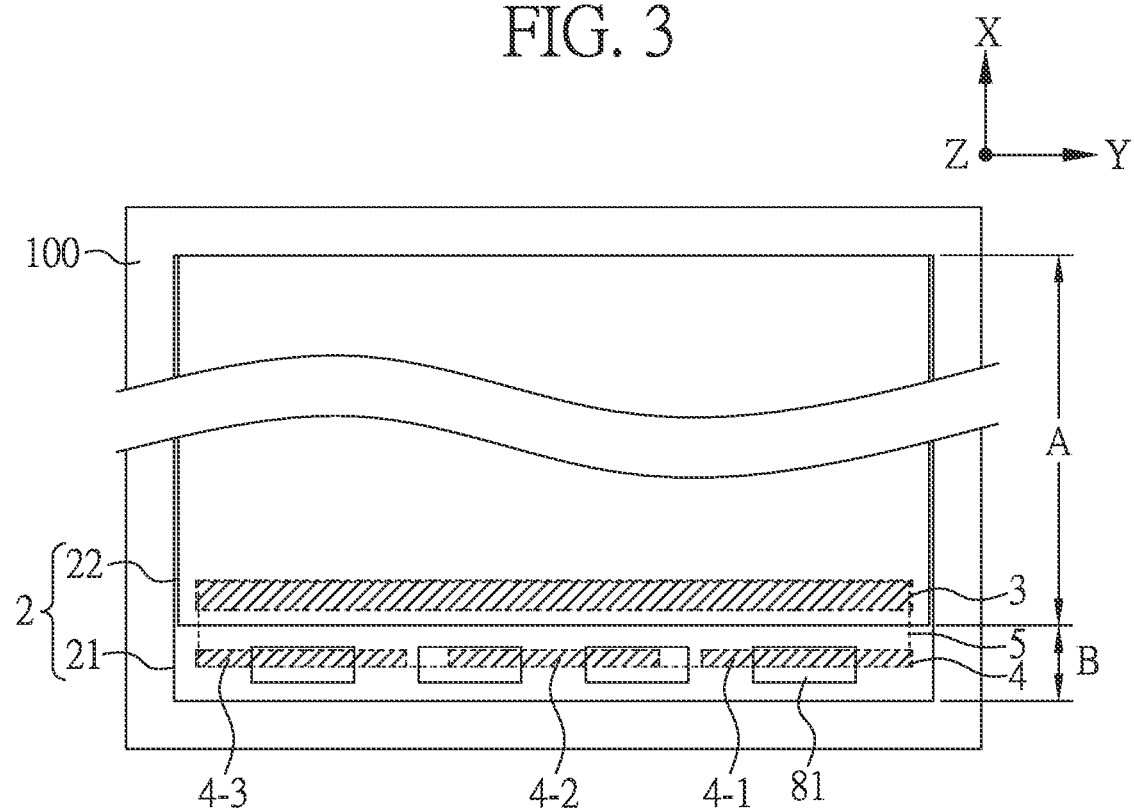
FIG. 4 is a partial perspective view of the electronic device in a top view direction according to another embodiment of the present disclosure.

FIG. 4 is a partial perspective view of an electronic device in a top view direction according to another embodiment of the present disclosure. For the convenience of description, in the perspective view of FIG. 4, some components are omitted. The electronic device in FIG. 4 is similar to the electronic device in FIG. 1 and FIG. 3 except for the following differences.

As shown in FIG. 4, there are one adhesive layer 3 and/or one connecting member 5 that extend along the peripheral circuit area B of the first substrate 21, and the adhesive member 4 is, for example, segmented into a plurality of portions (for example, portion 4-1, portion 4-2 and portion 4-3) that are arranged in sequence along the peripheral circuit area B of the first substrate 21, but it is not limited thereto. In other embodiments, one adhesive layer 3 may be corresponding to or connected with at least one connecting member 5 and at least one adhesive member 4, but it is not limited thereto. In other embodiments, one connecting member 5 may be corresponding to or connected with at least one adhesive layer 3 and at least one adhesive member 4, but it is not limited thereto. In other embodiments, one adhesive member 4 may be corresponding to or connected with at least one adhesive layer 3 and at least one connecting member 5, but it is not limited thereto.

Figure 5:
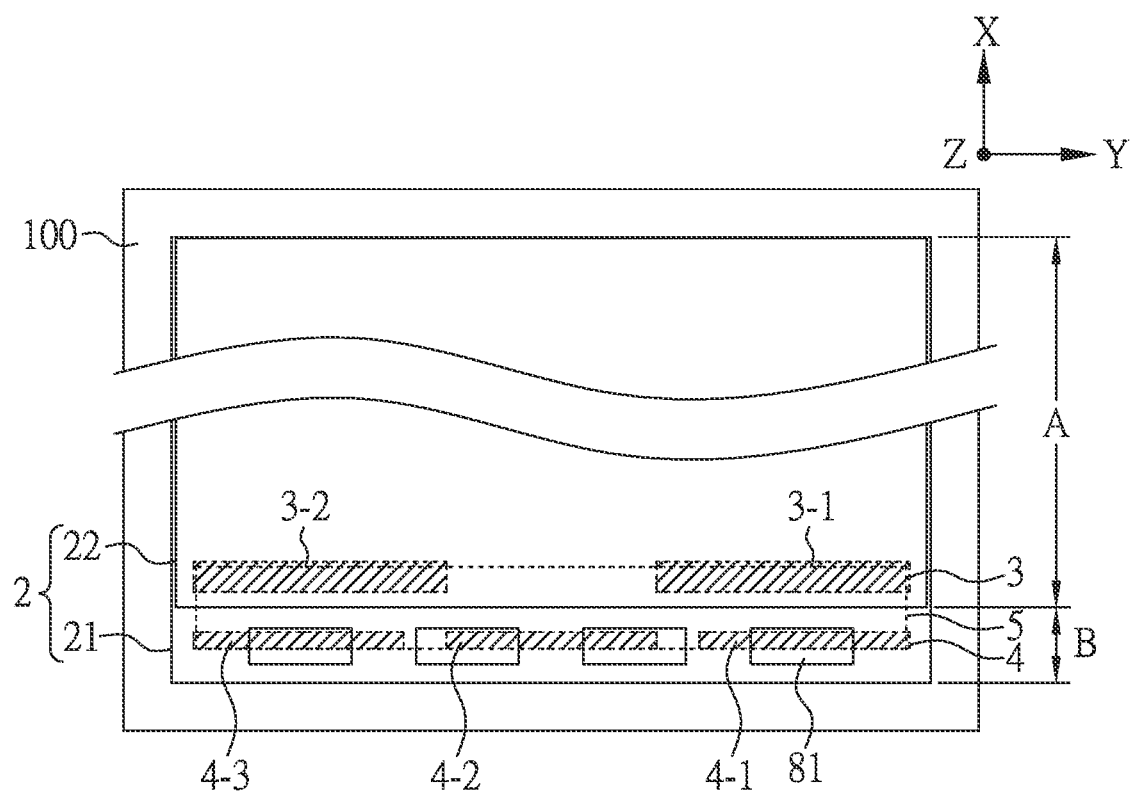
FIG. 5 is a partial perspective view of the electronic device in a top view direction according to still another embodiment of the present disclosure.

FIG. 5 is a partial perspective view of an electronic device in a top view direction according to still another embodiment of the present disclosure. For the convenience of description, in the perspective view of FIG. 5, some components are omitted. The electronic device in FIG. 5 is similar to the electronic device in FIG. 3, except for the following differences.

As shown in FIG. 5, the adhesive layer 3 may be segmented into a plurality of portions (for example, portion 3-1 and portion 3-2) that are arranged in sequence along the peripheral circuit area B of the first substrate 21. The adhesive member 4 may be segmented into a plurality of portions (for example, portion 4-1, portion 4-2 and portion 4-3) that are arranged in sequence along the peripheral circuit area B of the first substrate 21. There is, for example, one connecting member 5 that extends along the peripheral circuit area B of the first substrate 21. However, the present disclosure is not limited thereto. In some embodiments, the number of portions of the adhesive layer 3 (for example, portion 3-1 and portion 3-2) may be different from the number of portions of the adhesive member 4 (for example, portion 4-1, portion 4-2 and portion 4-3).

Figure 6:
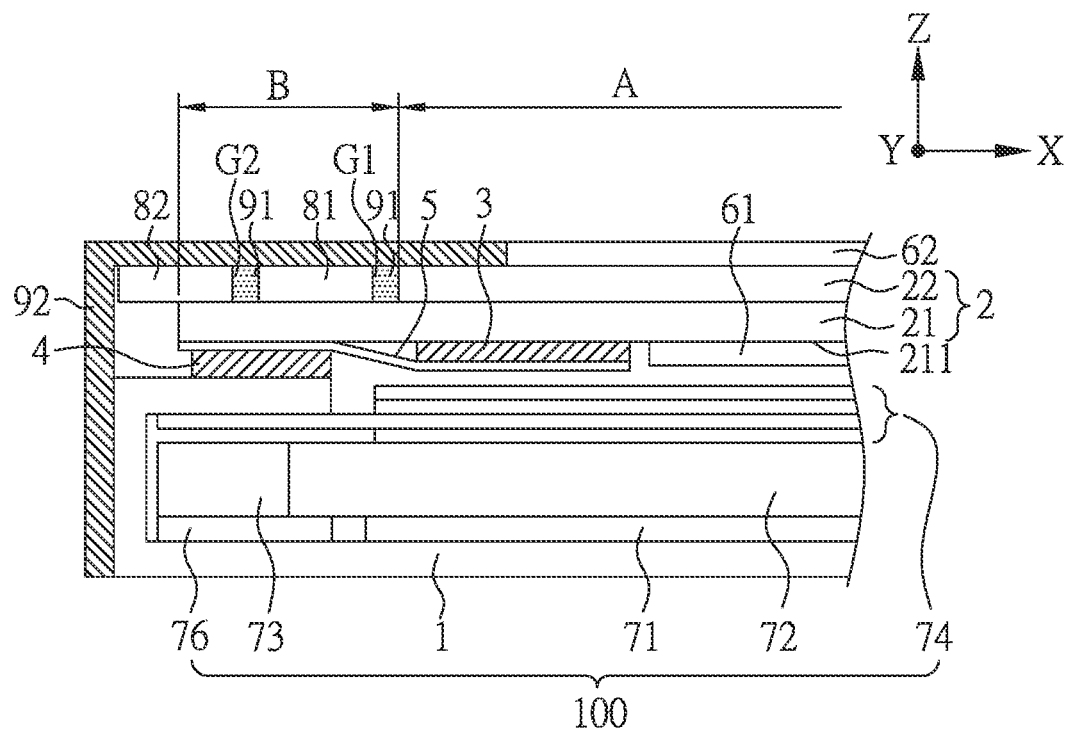
FIG. 6 is a partial cross-sectional view of the electronic device according to an embodiment of the present disclosure.

FIG. 6 is a partial cross-sectional view of an electronic device according to an embodiment of the disclosure. The electronic device of FIG. 6 is similar to that of FIG. 2A, except for the following differences.

As shown in FIG. 6, the electronic device of this embodiment may further include a protective glue 91 disposed adjacent to the circuit component 81, and the protective glue 91 may be used to protect the circuit component 81. In some embodiments, the protective glue 91 is disposed in the peripheral circuit area B, but it is not limited thereto. In other embodiments, the protective glue 91 may be partially disposed in the overlap area A. In other embodiments, the protective glue 91 may be partially disposed on part of the second substrate 22 and/or the second polarizer 62.

In some embodiments, the electronic device may further include a circuit board 82 disposed on the peripheral circuit area B of the first substrate 21, but it is not limited thereto. In some embodiments, the circuit component 81 may be disposed between the circuit board 82 and the second substrate 22 (or the second polarizer 62). In some embodiments, in the first direction X, there may be a gap G1 between the circuit component 81 and the second substrate 22, for example. The gap G1 is, for example, the smallest gap between the circuit component 81 and the second substrate 22 in the first direction X. In some embodiments, in the first direction X, there may be a gap G2 between the circuit component 81 and the circuit board 82, for example. The gap G2 is, for example, the smallest gap between the circuit component 81 and the circuit board 82 in the first direction X. In some embodiments, in the first direction X, the width of the gap G1 is, for example, the same as or different from the width of the gap G2. In some embodiments, the protective glue 91 may be disposed in the gap G1 and/or the gap G2, for example. In some embodiments, the circuit board 82 may be a hard printed circuit board or a flexible circuit board.

In other embodiments of the present disclosure, the electronic device may further include a light-shielding member 92 disposed on the circuit board 82, the circuit component 81 and/or part of the second substrate 22. In some embodiments, the light-shielding member 92 may be disposed adjacent to the light source 73 of the backlight module 100; that is, the light-shielding member 92 may be disposed on the light incident side of the backlight module 100. The light-shielding member 92 may be used for shielding light to improve dark-state light leakage or mura, but it is not limited thereto. In addition, as shown in FIG. 6, the light-shielding member 92 may extend to the outer side of the back frame 1, for example, so as to reduce light leakage at the side. In some embodiments, the light-shielding member 92 may include a black plastic material or a plastic material with low transmittance, such as a polymer plastic material, silicon glue, optical glue, hot melt glue, or any combination thereof, but it is not limited thereto. In other embodiments, the electronic device may further include other protective members instead of the light-shielding member 92 or arranged adjacent to the circuit board 82 and/or the circuit component 81.

Figure 7:
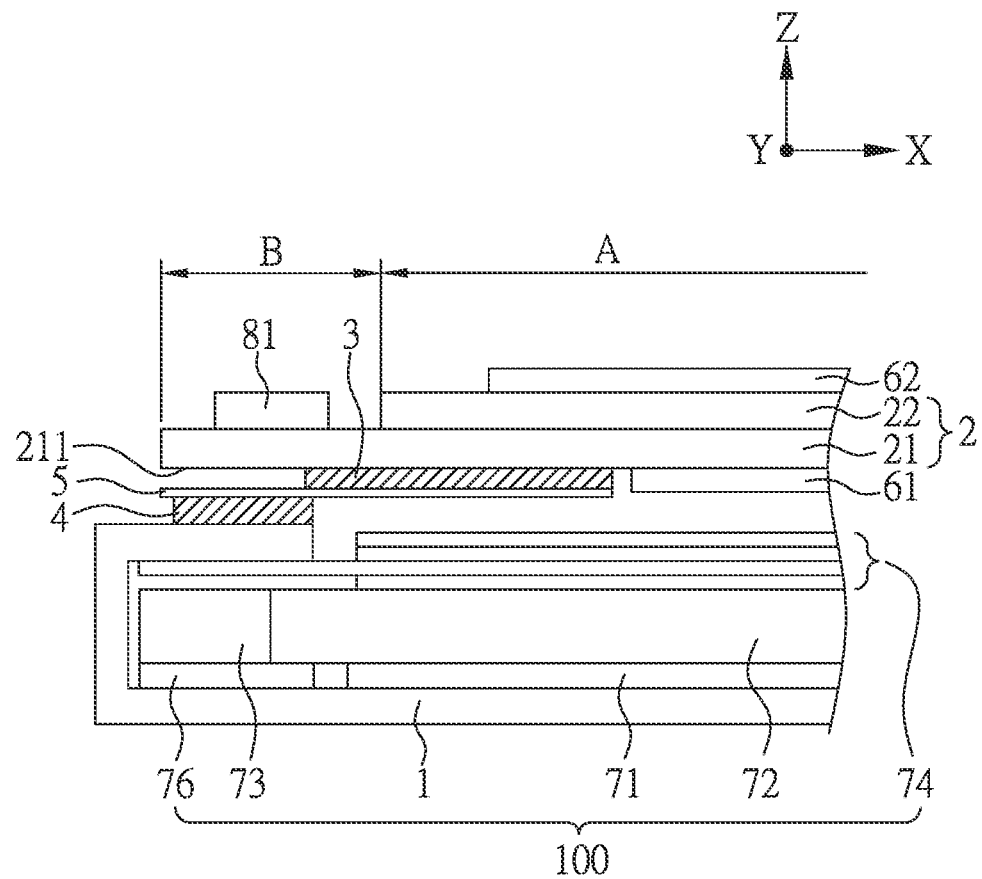
FIG. 7 is a partial cross-sectional view of the electronic device according to an embodiment of the present disclosure.

FIG. 7 is a partial cross-sectional view of an electronic device according to an embodiment of the present disclosure. The electronic device of FIG. 7 is similar to that of FIG. 2A, except for the following differences.

As shown in FIG. 7, the adhesive layer 3 may be adhered to part of the first surface 211 of the first substrate 21 (the surface away from the second substrate 22), and extends to part of the peripheral circuit area B. In some embodiments, in the normal direction Z of the panel 2, the adhesive layer 3 partially overlaps with the adhesive member 4, and the connecting member 5 is adhered between the adhesive layer 3 and the adhesive member 4. In some embodiments, the adhesive layer 3 may be arranged corresponding to the overlap area A and the peripheral circuit area B. In some embodiments, the adhesive layer 3 may overlap with the overlap area A and the peripheral circuit area B. In some embodiments, in the normal direction Z of the panel 2, at least part of the adhesive layer 3 may overlap with the adhesive member 4. In the electronic device of the present disclosure, the connecting member 5 may be arranged or adhered between the adhesive layer 3 and the adhesive member 4 to avoid direct contact between the adhesive member 4 and the panel 2 (for example, the first substrate 21), so as to reduce the pulling force generated by the adhesive member 4 between the panel 2 and the back frame 100 thereby alleviating the damage to the panel 2.

Figure 8A:
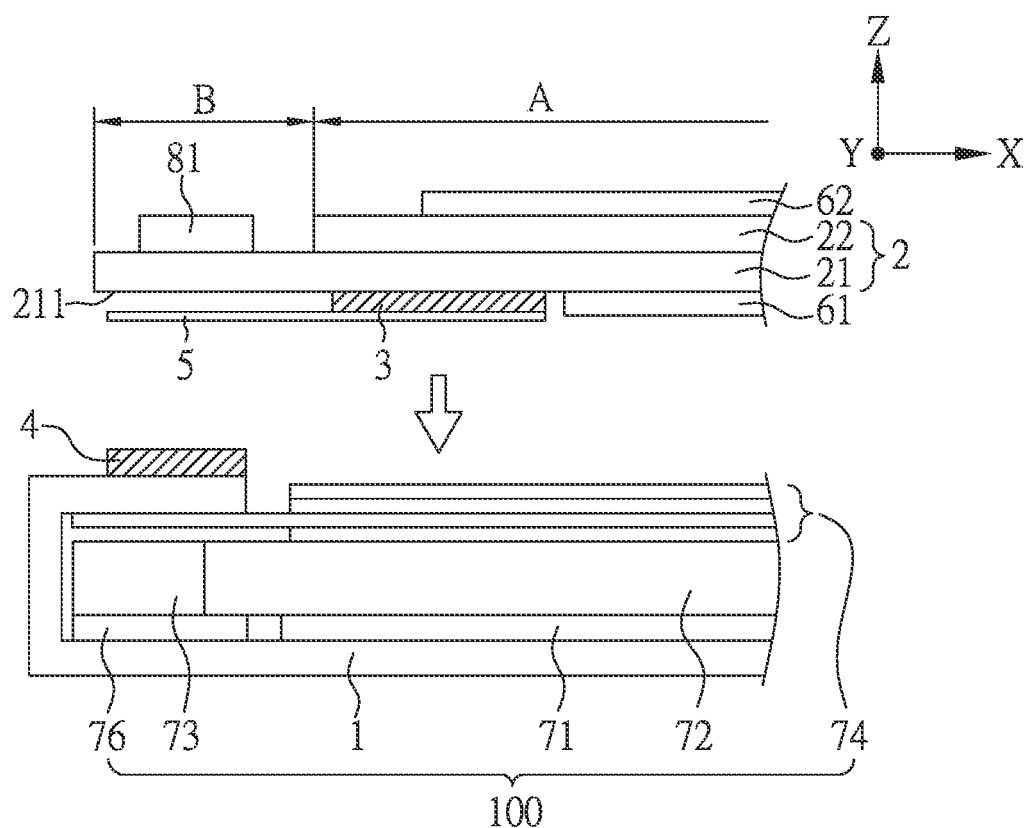
FIG. 8A and FIG. 8B are schematic diagrams illustrating the manufacturing process of the electronic device according to an embodiment of the present disclosure.
Figure 8B:
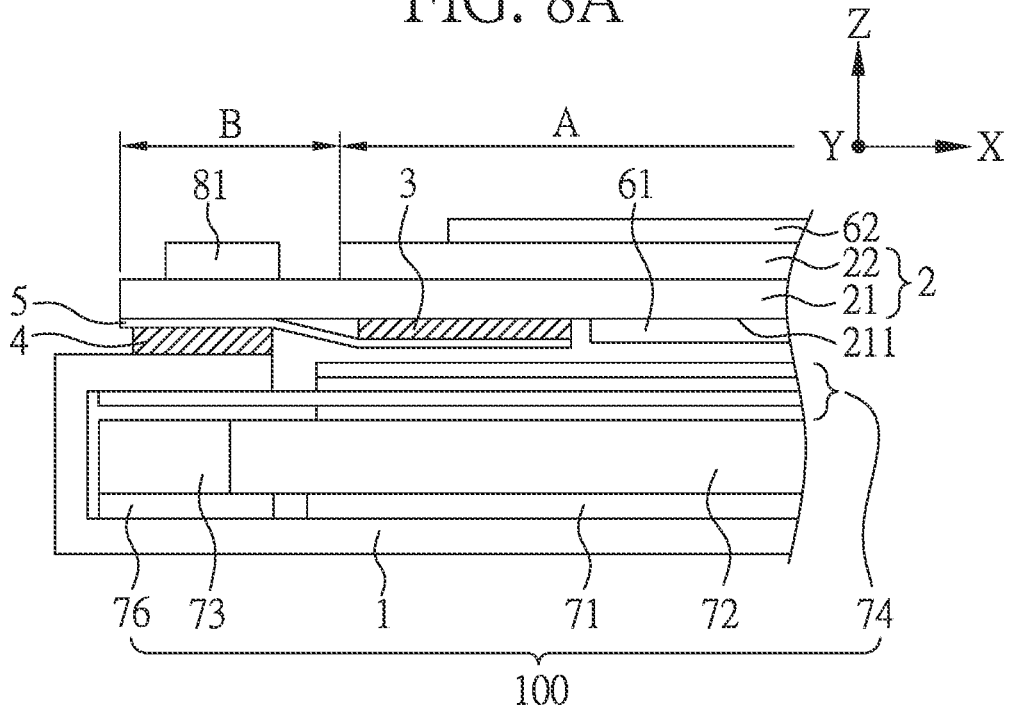

FIG. 8A and FIG. 8B are schematic diagrams illustrating the manufacturing process of the electronic device according to an embodiment of the present disclosure, wherein the electronic device of FIG. 2A is taken as an example, and the electronic devices of other embodiments of the present disclosure may also be prepared in the same manner.

As shown in FIG. 8A, a panel 2 and a backlight module 100 are provided respectively. The panel 2 includes a first substrate 21 and a second substrate 22, and the first substrate 21 and the second substrate 22 are disposed opposite to each other. In the normal direction Z of the panel 2, the first substrate 21 has an overlap area A. The overlap A overlaps with the second substrate 22. The adhesive layer 3 may be arranged corresponding to the overlap area A, or overlap with the overlap area A. In some embodiments, the backlight module 100 may include a back frame 1. An adhesive member 4 is adhered to the back frame 1, and a connecting member 5 is adhered to the adhesive layer 3 and the adhesive member 4. For example, the connecting member 5 is adhered between the adhesive layer 3 and the adhesive member 4. In the present disclosure, there is no particular restriction on the arrangement sequence of the connecting member 5. For example, the connecting member 5 may be attached to the adhesive layer 3 first, and then the adhesive layer 3 may be adhered to the panel 2, but it is not limited thereto. In another embodiment, the adhesive layer 3 may be adhered to the panel 2 first, and then the connecting member 5 and the adhesive layer 3 may be adhered, but it is not limited thereto this. In another embodiment, the connecting member 5 and the adhesive member 4 may be attached first, and then the adhesive member 4 is adhered to the back frame 1, but it is not limited thereto. In another embodiment, the adhesive member 4 may be adhered to the back frame 1 first, and then the connecting member 5 is attached to the adhesive member 4, but it is not limited thereto.

Next, the panel 2 and the backlight module 100 are paired and assembled, and the connecting member 5 is adhered between the adhesive layer 3 and the adhesive member 4 to form an electronic device as shown in FIG. 8B. In the normal direction Z of the panel 2, the adhesive member 4 does not overlap with the overlap area A. In other embodiments, as shown in FIG. 7, in the normal direction Z of the panel 2, at least part of the adhesive layer 3 may overlap with the adhesive member 4.

In summary, the present disclosure may reduce light leakage or mura, and further fix the panel 2 and the back frame 1 by disposing the connecting member 5 between the adhesive layer 3 and the adhesive member 4, so that the adhesive member 4 does not directly contact the panel 2 (for example, the first substrate 21).

In the present disclosure, the panel 2 of the aforementioned embodiment may be a display panel to form a display device, but it is not limited thereto. The display device may be a bendable or flexible display device. The display device may include, for example, a tiled display device, but it is not limited thereto. In addition, the appearance of the display device may include a rectangle, a circle, a polygon, a shape with a curved edge, or other suitable shapes. Furthermore, the display device may be applied to any electronic device that needs a display screen known in the art, such as displays, mobile phones, notebook computers, video cameras, cameras, music players, mobile navigation devices, televisions, and other electronic devices that need to display images. In addition, the panel 2 of the present disclosure may also be used together with a touch panel to form a touch display device.

The aforementioned specific embodiments should be construed as merely illustrative, and not limiting the rest of the present disclosure in any way, and the features between different embodiments can be matched and combined as long as they do not conflict with each other.

What is claimed is:

1. An electronic device, comprising:
    a back frame;
    a panel arranged on the back frame, wherein the panel has a first substrate and a second substrate disposed opposite to each other, and the first substrate has an overlap area and a peripheral circuit area, the overlap area overlaps with the second substrate, and the peripheral circuit area does not overlap with the second substrate;
    an adhesive layer adhered to the panel and corresponding to the overlap area of the first substrate;
    an adhesive member adhered to the back frame; and
    a connecting member adhered to the adhesive layer and the adhesive member;
    wherein in a normal direction of the panel, the adhesive layer does not overlap with the peripheral circuit area.

2. The electronic device of claim 1, wherein, in the normal direction of the panel, the adhesive member does not overlap with the overlap area.

3. The electronic device of claim 1, wherein, in the normal direction of the panel, at least part of the connecting member does not overlap with the adhesive layer and the adhesive member.

4. The electronic device of claim 1, wherein the connecting member includes plastic material, dielectric material, light-shielding material, reflective material, or a combination thereof.

5. The electronic device of claim 1, further comprising:
    a circuit component disposed on the peripheral circuit area of the first substrate; and
    a protective glue arranged adjacent to the circuit component.

6. The electronic device of claim 1, wherein one side of the adhesive layer is adhered to part of the panel, and the other side of the adhesive layer is adhered to part of the connecting member.

7. The electronic device of claim 1, wherein one side of the adhesive member is adhered to part of the back frame, and the other side of the adhesive member is adhered to part of the connecting member.

8. The electronic device of claim 1, wherein, in a direction perpendicular to the normal direction of the panel, there is a distance between the adhesive layer and the adhesive member, and the distance is greater than or equal to a thickness of the connecting member.

9. The electronic device of claim 1, further comprising a first polarizer and a second polarizer, wherein the first polarizer is disposed on the first substrate, and the second polarizer is disposed on the second substrate.

10. The electronic device of claim 1, wherein the adhesive layer is adhered to a surface of the first substrate away from the second substrate, and extends to part of the peripheral circuit area of the first substrate.

11. The electronic device of claim 5, further comprising a circuit board disposed on the peripheral circuit area of the first substrate, wherein there is a gap between the circuit component and the circuit board, and the protective glue is arranged in the gap.

12. The electronic device of claim 5, wherein the adhesive layer is segmented into multiple portions, the adhesive member is segmented into multiple portions, or the connecting member is segmented into multiple portions.

13. The electronic device of claim 11, further comprising a light-shielding member disposed on the circuit board and the circuit component.

14. The electronic device of claim 13, further comprising a backlight module, wherein the backlight module includes a light source, and the light-shielding member is disposed adjacent to the light source.

15. The electronic device of claim 13, wherein the light-shielding member extends to an outer side of the back frame.

16. The electronic device of claim 9, wherein, in the normal direction of the panel, the first polarizer does not overlap with the adhesive layer.

17. The electronic device of claim 9, wherein, in a first direction that is perpendicular to the normal direction of the panel, there is a distance between the first polarizer and the adhesive layer, and the distance is a minimum distance between the first polarizer and the adhesive layer in the first direction.

18. The electronic device of claim 12, wherein the multiple portions of the adhesive member or the multiple portions of the connecting member are arranged in sequence along the peripheral circuit area of the first substrate.

* * * * *